(12) United States Patent
Stoeger et al.

(10) Patent No.: US 11,226,377 B2
(45) Date of Patent: Jan. 18, 2022

(54) METHOD FOR CARRYING OUT A SELF-TEST OF AN ELECTRICAL CONVERTER CIRCUIT, AND CONVERTER CIRCUIT AND VEHICLE LUMINAIRE

(71) Applicant: CONTINENTAL AUTOMOTIVE GMBH, Hannover (DE)

(72) Inventors: Christian Stoeger, Munich (DE); Emil Kovatchev, Munich (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 16/768,725

(22) PCT Filed: Oct. 4, 2018

(86) PCT No.: PCT/EP2018/077058
§ 371 (c)(1),
(2) Date: Jun. 1, 2020

(87) PCT Pub. No.: WO2019/105636
PCT Pub. Date: Jun. 6, 2019

(65) Prior Publication Data
US 2021/0173014 A1    Jun. 10, 2021

(30) Foreign Application Priority Data

Dec. 1, 2017 (DE) .............................. 102017221657

(51) Int. Cl.
*G01R 31/40* (2020.01)
*H05B 45/375* (2020.01)
(Continued)

(52) U.S. Cl.
CPC ........... *G01R 31/40* (2013.01); *B60Q 1/0094* (2013.01); *G01R 31/006* (2013.01);
(Continued)

(58) Field of Classification Search
CPC ..... G01R 31/40; G01R 31/006; B06Q 1/0094; H05B 45/375; H05B 45/50; H05B 45/38
See application file for complete search history.

(56) References Cited

U.S. PATENT DOCUMENTS

| | | | | |
|---|---|---|---|---|
| 5,132,685 A | * | 7/1992 | DeWitt | .......... G01R 31/318502 |
| | | | | 324/73.1 |
| 6,060,843 A | | 5/2000 | Primisser et al. | |

(Continued)

FOREIGN PATENT DOCUMENTS

| | | |
|---|---|---|
| CN | 104903739 A | 9/2015 |
| CN | 106026157 A | 10/2016 |

(Continued)

*Primary Examiner* — Dominic E Hawkins
(74) *Attorney, Agent, or Firm* — Laurence A. Greenberg; Werner H. Stemer; Ralph E. Locher

(57) ABSTRACT

A method carries out a self-test of an electrical converter circuit, by use of a control device, proceeding from a known operating point at which a predetermined electrical operating variable has a predetermined starting value, a measurement cycle is begun by the converter circuit being operated. It is additionally provided that the time since the starting of the measurement cycle is detected, and the electrical operating variable and the time constitute two monitoring variables of the self-test. The measurement cycle is ended if one of the two monitoring variables satisfies an ending criterion. A test value is then formed from a measurement value of the other of the two monitoring variables at the end of the measurement cycle and a check is made to ascertain whether the test value lies outside a predetermined reference interval. If so an error signal is generated.

17 Claims, 12 Drawing Sheets

(51) Int. Cl.
　　　*H05B 45/38*　　　(2020.01)
　　　*H05B 45/50*　　　(2020.01)
　　　*B60Q 1/00*　　　(2006.01)
　　　*G01R 31/00*　　　(2006.01)
　　　*G01R 31/72*　　　(2020.01)

(52) U.S. Cl.
　　　CPC ........... *H05B 45/375* (2020.01); *H05B 45/38* (2020.01); *H05B 45/50* (2020.01); *G01R 31/72* (2020.01)

(56) References Cited

U.S. PATENT DOCUMENTS

| | | | |
|---|---|---|---|
| 9,024,598 | B2 | 5/2015 | Hasegawa et al. |
| 9,207,265 | B1 | 12/2015 | Grisamore et al. |
| 9,684,036 | B2 | 6/2017 | Depond et al. |
| 2005/0231228 | A1 | 10/2005 | Mattes et al. |
| 2008/0285192 | A1 | 11/2008 | Phadke et al. |
| 2010/0079317 | A1 | 4/2010 | Feddeler et al. |
| 2011/0234255 | A1 | 9/2011 | Chobot |
| 2014/0368204 | A1 | 12/2014 | Siessegger et al. |
| 2017/0141569 | A1* | 5/2017 | Liu .................. G01R 31/14 |
| 2017/0374712 | A1* | 12/2017 | Qu .................... B60Q 1/44 |
| 2019/0026205 | A1* | 1/2019 | Jin ................... H03M 1/108 |

FOREIGN PATENT DOCUMENTS

| | | |
|---|---|---|
| CN | 206671411 U | 11/2017 |
| DE | 102013212149 A1 | 1/2015 |
| DE | 102013220491 A1 | 4/2015 |
| EP | 0876742 A1 | 11/1998 |
| GB | 2551596 A | 12/2017 |
| TW | 201541093 A | 11/2015 |
| WO | 2010150338 A1 | 12/2010 |

\* cited by examiner

METHOD FOR CARRYING OUT A SELF-TEST OF AN ELECTRICAL CONVERTER CIRCUIT, AND CONVERTER CIRCUIT AND VEHICLE LUMINAIRE

BACKGROUND OF THE INVENTION

Field of the Invention

The invention relates to a method for carrying out a self-test of an electrical converter circuit, in particular of a switching converter. The converter circuit can be a boost converter or a buck converter, for example. The invention also includes a converter circuit which can carry out the method according to the invention. Finally, the invention also encompasses a vehicle luminaire for a motor vehicle, said vehicle luminaire comprising the converter circuit according to the invention.

For circuits that have to comply with a certain safety standard, for example, a so-called plausibilization of the operating states is required. In the specific case, for an application or functional circuit that is supplied with a controlled current, such as an LED vehicle lighting system (LED—light-emitting diode), for example, that means that the current or its control must be checked for plausibility. Generally, it is thus necessary to check whether an electrical variable, such as a current intensity value of said electrical current, for example, lies within a reference interval. One example of the plausibilization of a current control is the supply of an LED vehicle luminaire having, for example, the safety classification ASIL-B (ASIL—Automotive Safety Integrity Level). That can involve the low-beam light of a motorcycle, for example, which must have a predetermined brightness upon entry into a tunnel in order that the driver does not have too little light available upon driving into the tunnel. In this case, the tolerance for fulfilling this safety objective (sufficient illumination of the roadway) is greater than the tolerance required for the actual current accuracy of the current control.

Therefore, consideration might be given to providing an additional simple measuring component in the converter circuit of the current control, such as, for example, the component INA169 from Texas Instruments. However, such an additional component nevertheless firstly costs money and secondly occupies space in the converter circuit. Both thus produce economic disadvantages.

SUMMARY OF THE INVENTION

The invention is based on the object, in the case of an electrical converter circuit, of carrying out a self-test for plausibilizing at least one predetermined electrical operating variable and/or a component to be tested of the converter circuit.

The object is achieved by the subjects of the independent patent claims. Advantageous developments of the invention are described by the dependent patent claims, the description that follows and the figures.

A first aspect of the invention provides a method for carrying out a self-test of an electrical converter circuit. Generally, the converter circuit can be a switching converter. A boost converter and/or a buck converter can be realized in this case. In the method, by means of a control device of the converter circuit, proceeding from a known operating point of the converter circuit at which a predetermined electrical operating variable, for example an electrical current, has a predetermined starting value, a measurement cycle is begun.

In this case, the operating variable is dependent in particular on at least one component of the converter circuit that is to be tested by the self-test. Thus, if the at least one component changes because it is defective, for example, then a change also results for the operating variable. The measurement cycle is begun by the converter circuit being operated. As a result, the electrical operating variable changes, i.e. a temporal profile results. In other words, the operating point is changed. If the at least one component to be tested is in a state as intended or is functionally serviceable, then the change in the electrical operating variable during the measurement cycle will have a predetermined, known profile. By contrast, if the converter circuit generally, that is to say in particular the at least one component, is defective or not functionally serviceable, then a different profile than that will result. In order to test this, provision is made for detecting the time since the beginning of the measurement cycle. The length of time for which the measurement cycle has already been running is thus measured. It is thus possible to determine what value the electrical operating variable should currently have given a functionally serviceable converter circuit or converter circuit functioning as intended. The electrical operating variable and the time thus constitute two monitoring variables of the self-test. The measurement cycle is ended if one of the two monitoring variables (that is to say the electrical operating variable or the time) satisfies a predetermined ending criterion. There are thus two variants of the method. In the first variant, the electrical operating variable constitutes the first monitoring variable taken as a basis for fixing when the measurement cycle ought to be ended (ending criterion). The time then constitutes the other monitoring variable, with respect to which the length of time for which the measurement cycle has lasted is determined. A check is thus made to ascertain for how long the electrical operating variable is required in order for example to reach a specific threshold value or generally to satisfy the ending criterion. In the second variant, by contrast, the time constitutes the first monitoring variable by virtue of the fact that there is a wait for a fixedly predetermined time duration to elapse and then the measurement cycle is ended. The other, second monitoring variable is then formed by the electrical operating variable, the measurement value of which is checked at the end of the measurement cycle.

Thus, there is a wait for a predetermined time duration to elapse and then there is a test to establish what measurement value the electrical operating variable has or has reached. The measurement cycle is thus ended in accordance with the ending criterion if the electrical operating variable has a predetermined end value (first variant) or after a predetermined measurement time (second variant). A test value is then formed from a measurement value of the other of the two monitoring variables at the end of the measurement cycle. Said test value can be directly the measurement value determined or else, for example, an average value of a plurality of measurement values (if a plurality of measurement cycles are carried out). A check is then made to ascertain whether said test value lies outside a predetermined reference interval. Said reference interval includes at least one okay test value, that is to say that it specifies all those test values for which it can be assumed that the converter circuit is okay or functionally serviceable or is functioning as intended. It is also possible to specify more than one okay test value in the reference interval in order thereby to provide a tolerance in the self-test. If the present test value lies outside the predetermined reference interval, an error signal is generated. By contrast, if the present test value lies within the reference interval, then it is assumed that the converter circuit is functionally serviceable or is functioning as intended.

The invention affords the advantage that a temporal behavior of the converter circuit is used as a basis for the self-test. Carrying out the self-test thus merely necessitates a time detecting unit such as can be realized by a counter, for example, which is typically part of a control device anyway if the latter is realized on the basis of a microcontroller. Consequently, a costly additional measuring circuit which would not also be provided for an actual control of the operating variable, for example, is not required.

The invention also encompasses embodiments that afford additional advantages.

One embodiment provides for a current intensity of the converter circuit, for example of an output current or of a coil current of an inductance, or else an electrical voltage correlated with the current intensity or an output voltage of the converter circuit to be detected as the operating variable. Monitoring or testing the current intensity or an electrical voltage correlated with the current intensity affords the advantage that, for example, a luminous intensity of a light-emitting diode arrangement supplied by the converter circuit can be deduced. Testing or monitoring an output voltage of the converter circuit affords the advantage that it is possible to identify whether the output voltage has a detrimentally high value for the functional circuit connected downstream (for example a functional circuit having a light-emitting diode arrangement). Two or more of the abovementioned electrical variables in combination can also be detected and checked. The electrical voltage correlated with the current intensity can be determined by means of a shunt resistor, for example.

A plurality of embodiments concern the choice of said first monitoring variable that has to satisfy the ending criterion for the measurement cycle. The electrical operating variable and the time are available for selection here.

One embodiment provides for the ending criterion to stipulate that the electrical operating variable must have a predetermined end value. The first monitoring variable is thus the electrical operating variable, that is to say e.g. a current intensity. Accordingly, the measurement value for forming the test value then relates to the other monitoring variable, that is to say the time. The test value is thus likewise a time value and the reference interval specifies at least one okay time value. Thus, from the beginning of the measurement cycle there is a wait until the electrical operating variable exceeds or falls below or reaches e.g. a predetermined threshold value. This point in time is then detected as a measurement value. The test value formed therefrom is then compared with the reference interval in order to establish whether the operating variable has reached the threshold value at a time value which lies within the reference interval. In this case, the at least one component of the converter circuit is then considered to be okay. Otherwise, said error signal is generated.

One embodiment in this respect provides that, for monitoring the threshold value, use is made of a comparator or a digital comparison unit of the converter circuit, which can be present anyway for the control of a voltage or a current. A digital comparison unit is a programming equivalent to a comparator. Consequently, there is no need for an additional component for the threshold value comparison. The converter circuit thus comprises a two-point controller having at least one comparator or a corresponding digital comparison unit for a control of the voltage or the current. The ending criterion is implemented by means of the at least one comparator or the digital comparison unit of the two-point control.

However, the time can also be taken as a basis for the monitoring variable for the ending criterion. In this embodiment, the ending criterion stipulates a predetermined time duration for the time and the test value is then correspondingly formed on the basis of the remaining monitoring variable, namely the electrical operating variable, that is to say that the test value is a value for the electrical operating variable. The reference interval correspondingly stipulates at least one okay value for the electrical operating variable. The measurement cycle is thus started and there is a wait for a predetermined fixed time duration to elapse. A test is then carried out to establish what value the electrical operating variable has assumed after this time duration. If the test value thus formed lies within the reference interval, the converter circuit is regarded as okay. Otherwise, said error signal is generated.

In accordance with one embodiment, the time is detected by means of a counter of the control device in the manner described. Such a counter can be part of a microcontroller of the control device, for example. This embodiment is technically particularly simple to realize.

One embodiment concerns the question of what value or what values the reference interval ought to comprise or contain. This is dependent on the design of the converter circuit, that is to say e.g. on the at least one component to be tested that is used. In accordance with this embodiment, in a calibration phase, in which it is known that the converter circuit or, in particular, the at least one component to be tested is error-free, the measurement cycle is likewise carried out. The calibration phase can be effected for example after the production of the converter circuit and prior to actual delivery to a user. The measurement cycle is carried out at least once. Said test value that results at the end of the at least one measurement cycle carried out is then available. From the test value, the reference interval is generated on the basis of at least one predetermined tolerance value. The reference interval thus specifies the test value determined in the calibration phase and can additionally include around the test value a tolerance interval formed on the basis of the tolerance value.

In the actual self-test, too, one embodiment provides for the measurement cycle to be carried out multiply, such that a plurality of measurement values are present. The test value is then formed as an average value of the plurality of measurement values. The influence of measurement noise can be reduced as a result.

In accordance with one embodiment, an inductance of the converter circuit is tested by means of the self-test. Said inductance can be the energy store for a boost converter and/or buck converter of the converter circuit. This embodiment has the advantage that the component that is the most influential with regard to the functioning of the converter circuit is monitored.

As already described, the measurement cycle is begun by the converter circuit being operated. In accordance with one embodiment, for the measurement cycle the converter circuit is operated by virtue of the fact that a switch of the converter circuit is closed, and as a result, a current intensity of an electric current through the switch rises or falls continuously, for the duration of the measurement cycle. The continuous dynamic behavior of the converter circuit is thus tested. In this case, the self-test preferably has a time duration shorter than 20 microseconds, such that an exponential rise or exponential fall in the electrical current can be approximated by a linearization. This embodiment has the advantage that no switching process is effected during the measurement cycle and, as a result, the self-test is of particularly simple design.

One embodiment provides for a start of operation of the converter circuit, at which the electrical operating variable is equal to zero, to be used as said operating point from which the measurement cycle is started. In other words, the change in the electrical operating variable in the measurement cycle proceeding from the value zero is detected. This affords the advantage that an influence of a capacitance and/or of an output voltage (at an output of the converter circuit) has no perturbing effect or no influence on the test value. In particular, at the operating point an output voltage of the converter circuit is also equal to zero and/or the capacitance is discharged.

One embodiment provides for the condition to be met that at the operating point, that is to say at the start of the measurement cycle, and also for each measurement value within the reference interval, that is to say if the converter circuit is functionally serviceable or ok, the electrical output voltage of the converter circuit remains below a working voltage of a functional circuit supplied by the converter circuit. In other words, the self-test is carried out but in the process the electrical output voltage of the converter circuit remains below the working voltage, such that the functional circuit connected downstream of the converter circuit remains deactivated. As a result, the self-test can be carried out without the functional circuit commencing its work or its operation.

In particular, an embodiment is provided in which, as the functional circuit, an LED lighting unit having a light-emitting diode arrangement is supplied by the converter circuit. In other words, the LED lighting unit remains dark while the self-test is being carried out.

A further aspect of the invention relates to the converter circuit having the control device which is configured to carry out an embodiment of the method according to the invention. The converter circuit can be a switching converter, in particular.

A further aspect of the invention relates to the combination of the converter circuit with a functional circuit connected downstream in the form of an LED lighting unit having a light-emitting diode arrangement. In this context, the invention relates, in particular, to a vehicle luminaire for a motor vehicle comprising an embodiment of the converter circuit according to the invention. The vehicle luminaire can be configured for example as a headlight for a motor vehicle. The motor vehicle can be an automobile such as, for example, a car or truck, an agricultural machine or a motorcycle.

Exemplary embodiments of the invention are described below.

DETAILED DESCRIPTION OF THE INVENTION

The exemplary embodiments explained below are preferred embodiments of the invention. In the exemplary embodiments, the described components of the respective embodiment each represent individual features of the invention that should be considered independently of one another, and that each also develop the invention independently of one another and can therefore also be considered to be part of the invention, either individually or in a combination other than that shown. Furthermore, the described embodiments may also be supplemented by further features of the invention from among those that have already been described.

In the figures, functionally identical elements are in each case provided with the same reference signs.

Figure 1:
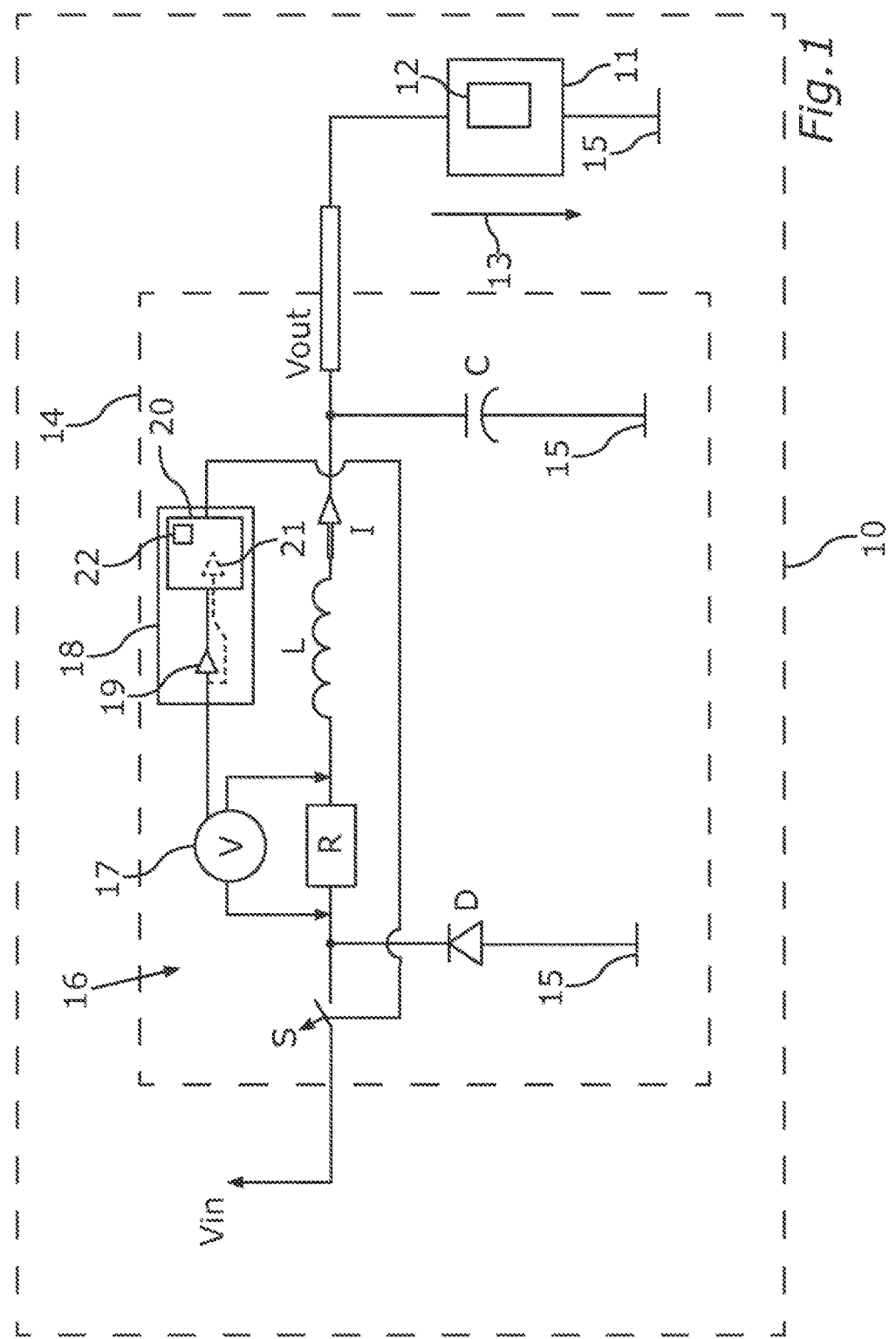
FIG. 1 shows a schematic illustration of one embodiment of the vehicle luminaire according to the invention.

FIG. 1 shows a vehicle luminaire 10, which can be incorporated in a motor vehicle or can be provided for a motor vehicle. The vehicle luminaire 10 can be embodied for example as a headlight for illuminating surroundings of the motor vehicle. This can be a headlight for a motorcycle, for example. The vehicle luminaire 10 can comprise a functional circuit 11, which can include a light-emitting diode arrangement 12, for example. In this case, the functional circuit 11 is thus an LED lighting unit.

The light-emitting diode arrangement 12 can generate light when it is supplied with a working voltage 13. In the case of the vehicle luminaire 10, the working voltage 13 can be generated by means of a converter circuit 14, which generates an output voltage Vout from a supply voltage Vin by means of a voltage conversion, which output voltage can be provided as a working voltage 13. In the converter circuit 14, electrical circuits can be closed by a ground potential 15, which can be formed for example on the basis of bodywork or a frame of the motor vehicle. The supply voltage Vin can be generated or provided for example by an onboard electrical system of the motor vehicle. The supply voltage Vin can have a voltage value in a range of 10 volts to 50 volts, for example.

The output voltage Vout can have a voltage value which is different than the voltage value of the supply voltage Vin. For this purpose, the converter circuit 14 can provide a switching converter 16, which is a buck converter in the example shown in FIG. 1. The switching converter 16 can also be configured as a boost converter. The converter circuit 14 can comprise, for realizing the switching converter 16, an electronic switch S, a rectifying element, such as, for example, a diode D, an inductance L, for example an inductor coil, and an output capacitance C as output capacitor or storage capacitor. The stated elements can be interconnected in a manner known per se. A measurement resistor R can be provided for controlling a current intensity of a current I of the inductance L. The measurement resistor R can be embodied as a shunt resistor. An electrical voltage V dropped across the measurement resistor R can be measured or detected by means of a measuring circuit 17 in a manner known per se. The voltage V arises as a potential difference between the two potentials RH and RL, between which the measurement resistor R can be connected. The voltage V constitutes an electrical operating variable of the converter circuit 14 and correlates with the current intensity of the current I.

The control of the current I and/or of the output voltage Vout can be carried out by means of a control device 18. For this purpose, the control device 18 can comprise at least a comparator 19 and a microcontroller 20, for example. Instead of the comparator 19, a comparison of the voltage value of the voltage V, that is to say generally of an electrical operating variable, can also be carried out by a digital comparison unit 21 of the microcontroller 20. For this purpose, the microcontroller 20 can be coupled to the measuring circuit 17 via an analog-to-digital converter. The control device 18 can be coupled to the switch S in order to switch the switch S for the control of the current I and/or of the output voltage Vout. The control device 18 can furthermore comprise a counter 22, which can be realized by means of the microcontroller 20, for example. The counter 22 can be provided for measuring the time t.

The converter circuit 14 can also be provided or used in a device other than a vehicle luminaire 10.

Figure 2:
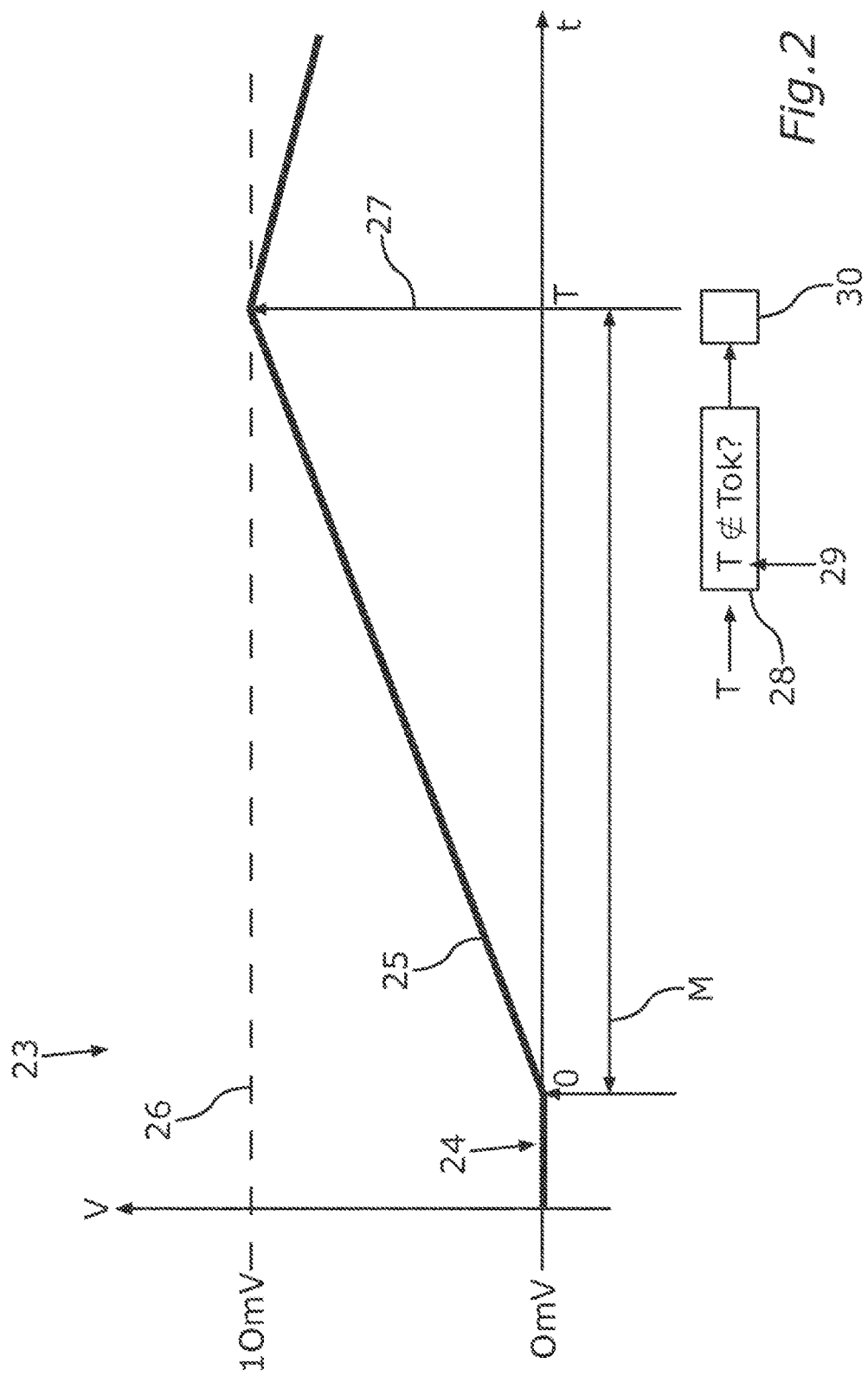
FIG. 2 shows a diagram with a schematic profile of an electrical operating variable of a converter circuit of the vehicle luminaire from FIG. 1.

FIG. 2 illustrates how a self-test 23 can be realized by means of the control device 18 on this basis. By means of the self-test 23, it is possible to test for example the inductance L as a component of the converter circuit 14. The inductance L thus constitutes a component of the converter circuit 14 that is to be tested by the self-test 23. The voltage V and the time can be provided as monitoring variables for the self-test 23.

The self-test 23 proceeds from a predetermined operating point 24. The operating point 24 can consist in the controlled electrical operating variable, that is to say for example the voltage V, having a value of 0, that is to say that V=0 mV holds true at the operating point 24.

This means that the current I has a current intensity value of 0 amperes. Proceeding from the operating point 24, the switch S is closed, such that the converter circuit 14 is operated, that is to say that the supply voltage Vin takes effect in the switching controller 16. With the closing of the switch S, a measurement cycle M begins. A temporal profile 25 of the electrical operating variable, that is to say here of the voltage V, arises over time t. The measurement cycle M is ended if the electrical operating variable, that is to say the voltage V, satisfies an ending criterion 26, which here can consist in the voltage V reaching a threshold value 27, which is 10 mV in the embodiment shown. The threshold value 27 constitutes an end value for the operating variable to be tested, at which the measurement cycle M is ended.

Consequently, a measurement time T, i.e. a measurement value of the time duration, is detected which lasts from the beginning of the measurement cycle M until the ending criterion 26 is reached or satisfied. The measurement time T constitutes a measurement value which can also be used directly as a test value 29 in a test step 28 in order to check whether the test value 29, that is to say here the measurement time T, lies outside a reference interval Tok. If the test value 29 lies outside the reference interval Tok, an error signal 30 can be generated. The error signal 30 signals that the test value 29 lies outside the reference interval Tok. The reference interval Tok can thus be defined or chosen in such a way that it specifies or contains or defines all those permissible ok test values which result if the converter circuit 14 is functioning as intended or is functionally serviceable. In other words, if the test value 29 lies outside the reference interval Tok, then this means that the converter circuit 14 is not functioning as intended or is not functionally serviceable. Consequently, a measure for warning and/or protecting a user can be controlled on the basis of the error signal 30. By way of example, the functional circuit 11 can be switched off.

Figure 3:
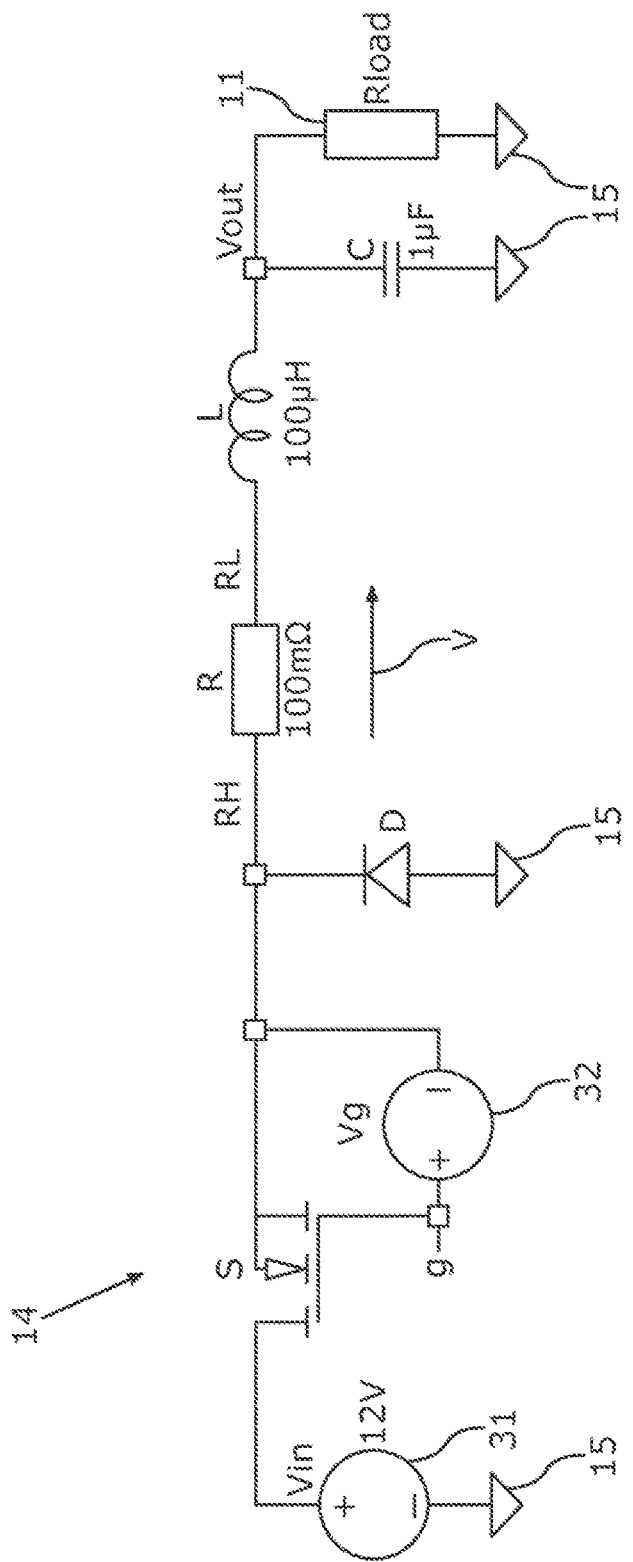
FIG. 3 shows a schematic circuit diagram of one possible configuration of the converter circuit.

FIG. 3 shows one possible configuration of the converter circuit 14 for realizing a buck converter. The switch S can be realized on the basis of a transistor, in particular an FET (field effect transistor).

An onboard electrical system 31 is symbolized by a voltage source. The supply voltage Vin can be 12 volts, for example. The other components are also described by way of example with concrete values. The functional circuit 11 constitutes a load resistance Rload. A control circuit 32 for providing a gate voltage Vg for a gate g of the transistor of the switch S is symbolized by a voltage source in FIG. 3.

Figure 4:
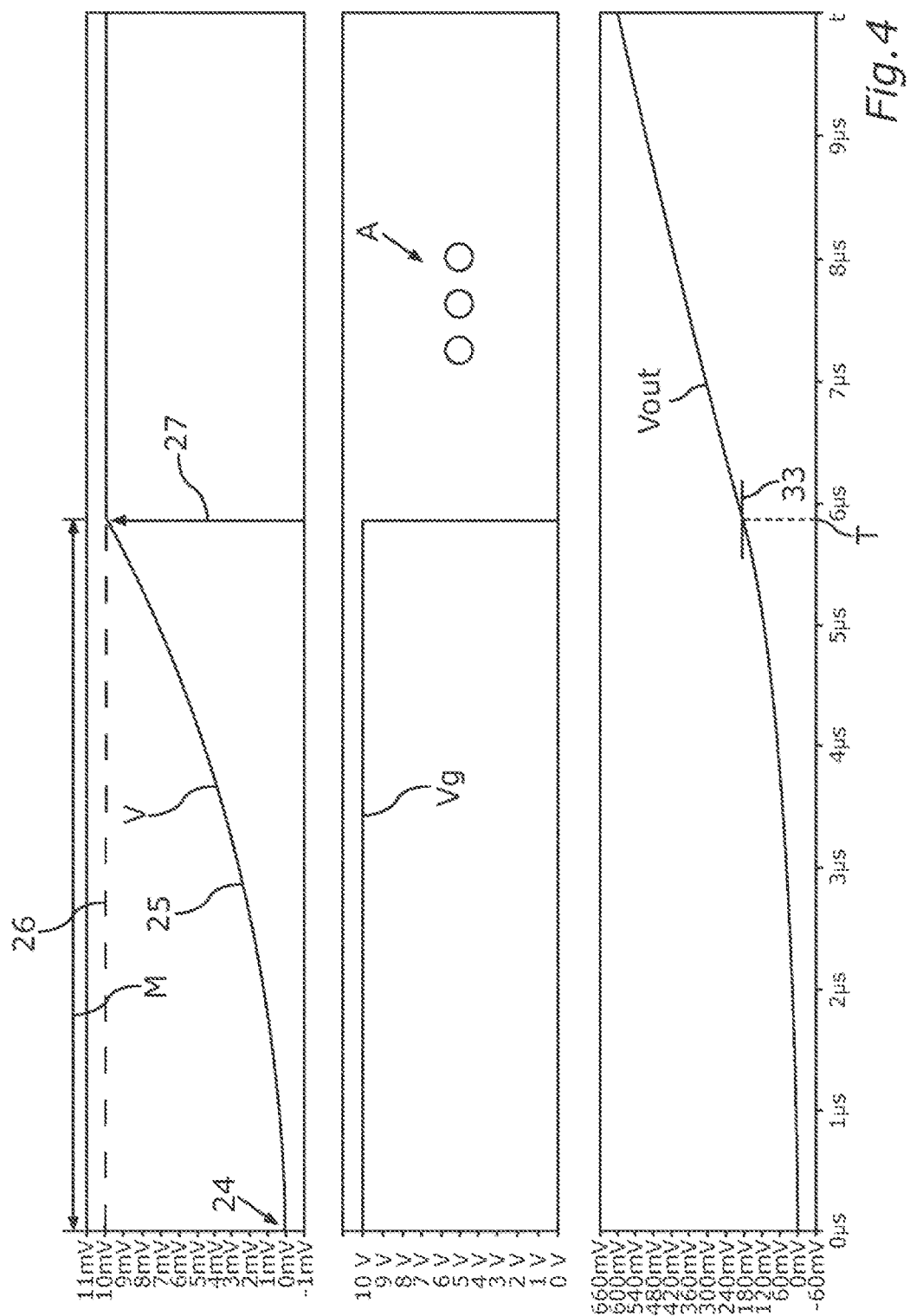
FIG. 4 shows diagrams with schematic profiles of electrical voltages of the converter circuit from FIG. 3.

FIG. 4 shows against time t the resulting profiles for the voltage V which is used as an electrical operating variable, which serves as a monitoring variable, and also the gate voltage Vg and the output voltage Vout. The operating point 24 at which the measurement cycle M begins is given once again by I=0 amperes. The invention can generally involve the start of operation of the converter circuit 14 if the latter, after a relatively long pause in operation, in particular longer than 100 ms or 10 s or longer than 1 min, is first supplied again with the supply voltage Vin by the closing of the switch S. The measurement cycle M ends when the voltage V has reached the threshold value 27 of the ending criterion 26. The then resultant measured measurement time T of the measurement cycle M can again be used as a test value 29 for the test step 28. At the end of the measurement cycle M, the output voltage Vout has a voltage value 33 which is less than the working voltage 13, at which the functional circuit 11 commences operation, that is to say that, for example, the light-emitting diode arrangement 12 generates light. The further profile of the gate voltage Vg after the end of the measurement cycle M is not illustrated in more specific detail in FIG. 4, which is indicated by ellipsis A in FIG. 4.

Figure 5:
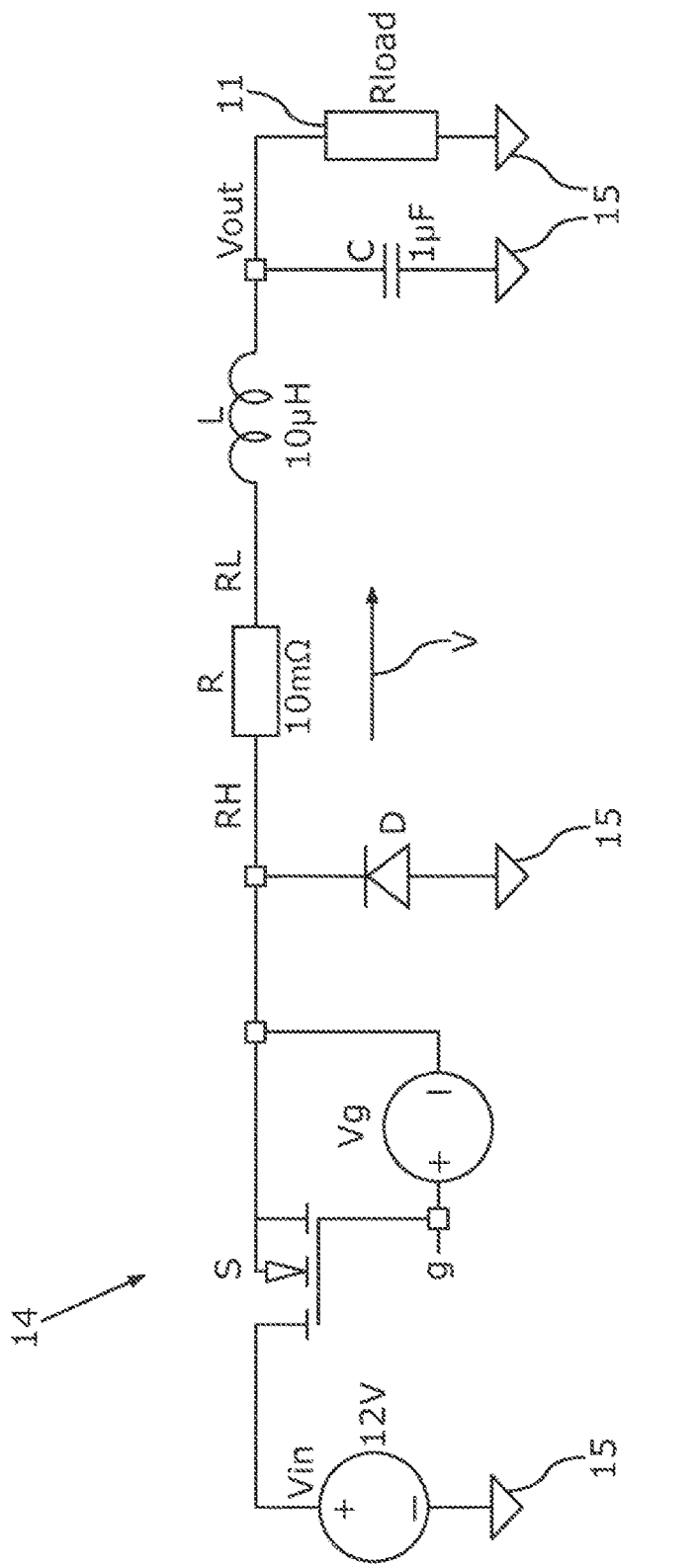
FIG. 5 shows a schematic circuit diagram of a further configuration of the converter circuit.

FIG. 5 illustrates a further possible configuration of the converter circuit 14, in which a higher switching frequency results in comparison with the converter circuit in accordance with FIG. 3 because the inductance L has a lower inductance value.

Figure 6:
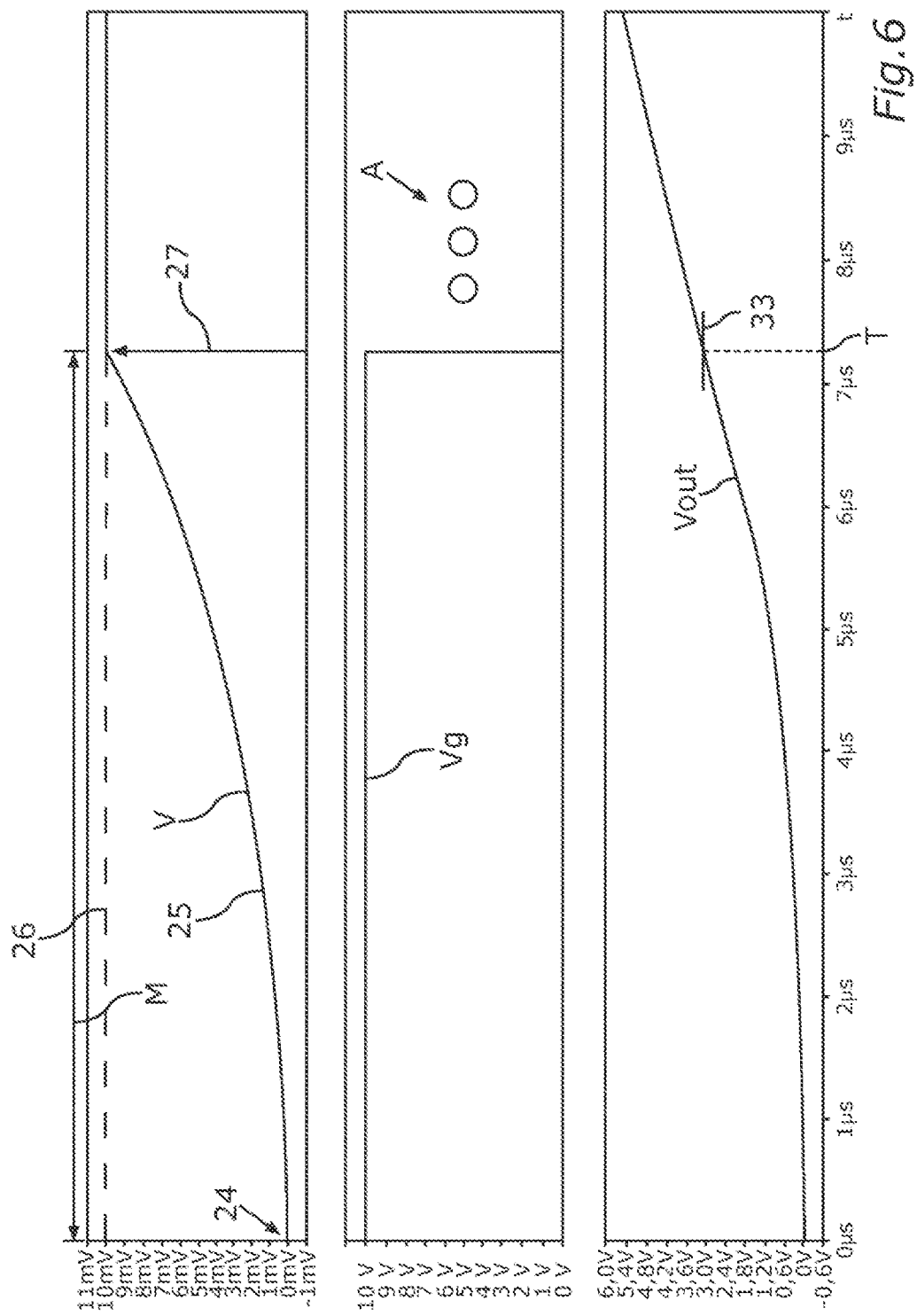
FIG. 6 shows a diagram with schematic profiles of electrical voltages of the converter circuit from FIG. 5.

FIG. 6 illustrates that in this case, too, over time t suitable profiles of the voltage V, of the gate voltage Vg and of the output voltage Vout result, on the basis of which a technically realizable ending criterion 26 can be defined. The further profile of the gate voltage Vg after the end of the measurement cycle M is in turn not illustrated in more specific detail in FIG. 6, which is indicated by ellipsis A in FIG. 6.

Figure 7:
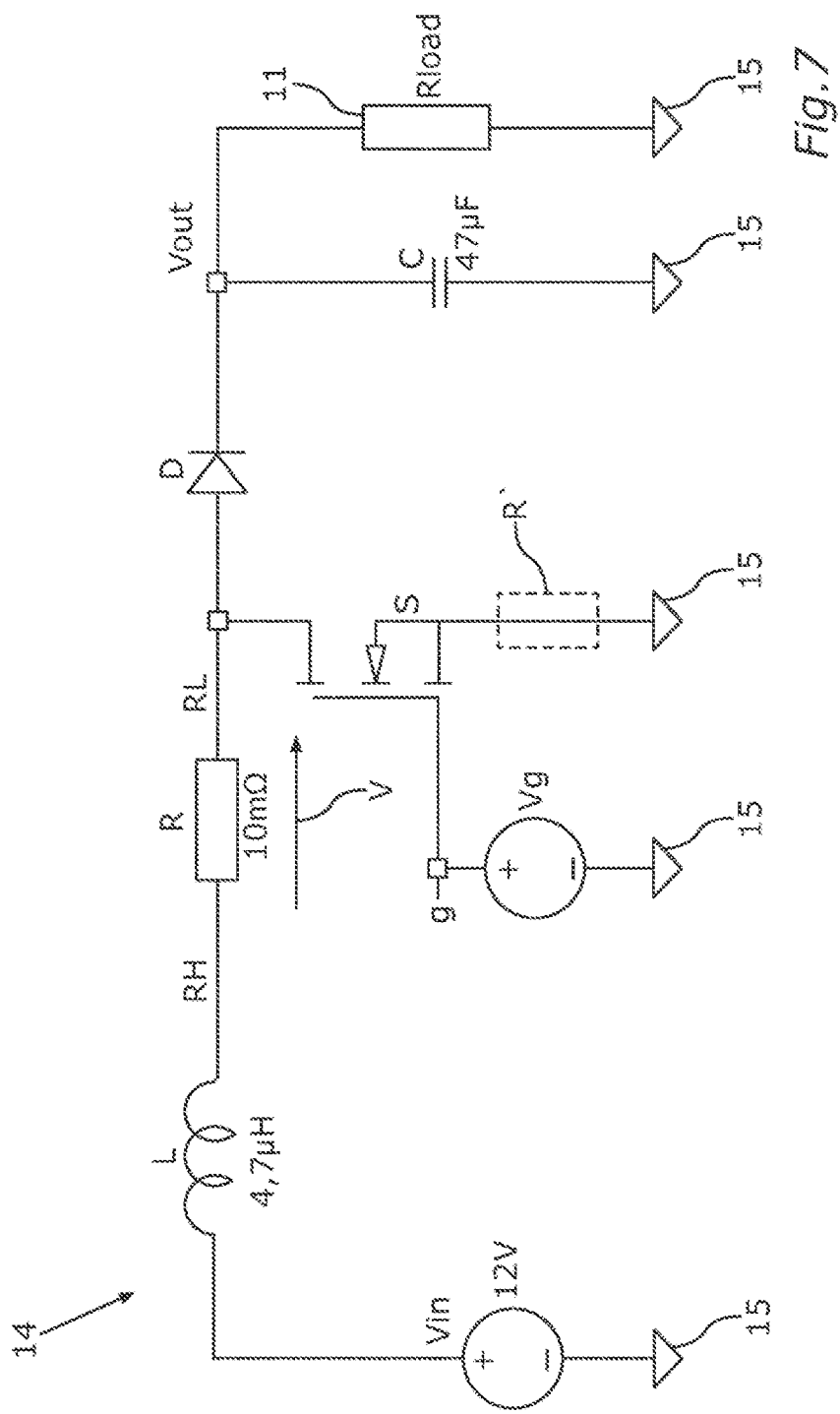
FIG. 7 shows a schematic circuit diagram of a further configuration of the converter circuit.

FIG. 7 illustrates one configuration of the converter circuit 14 as a boost converter.

FIG. 7 illustrates that, in this embodiment, the measurement resistor R can also be connected upstream or downstream of the switch S, that is to say that a measurement resistor R' can be connected e.g. between the switch S and the ground potential 15. The measurement resistor R is not necessary in that case.

Figure 8:
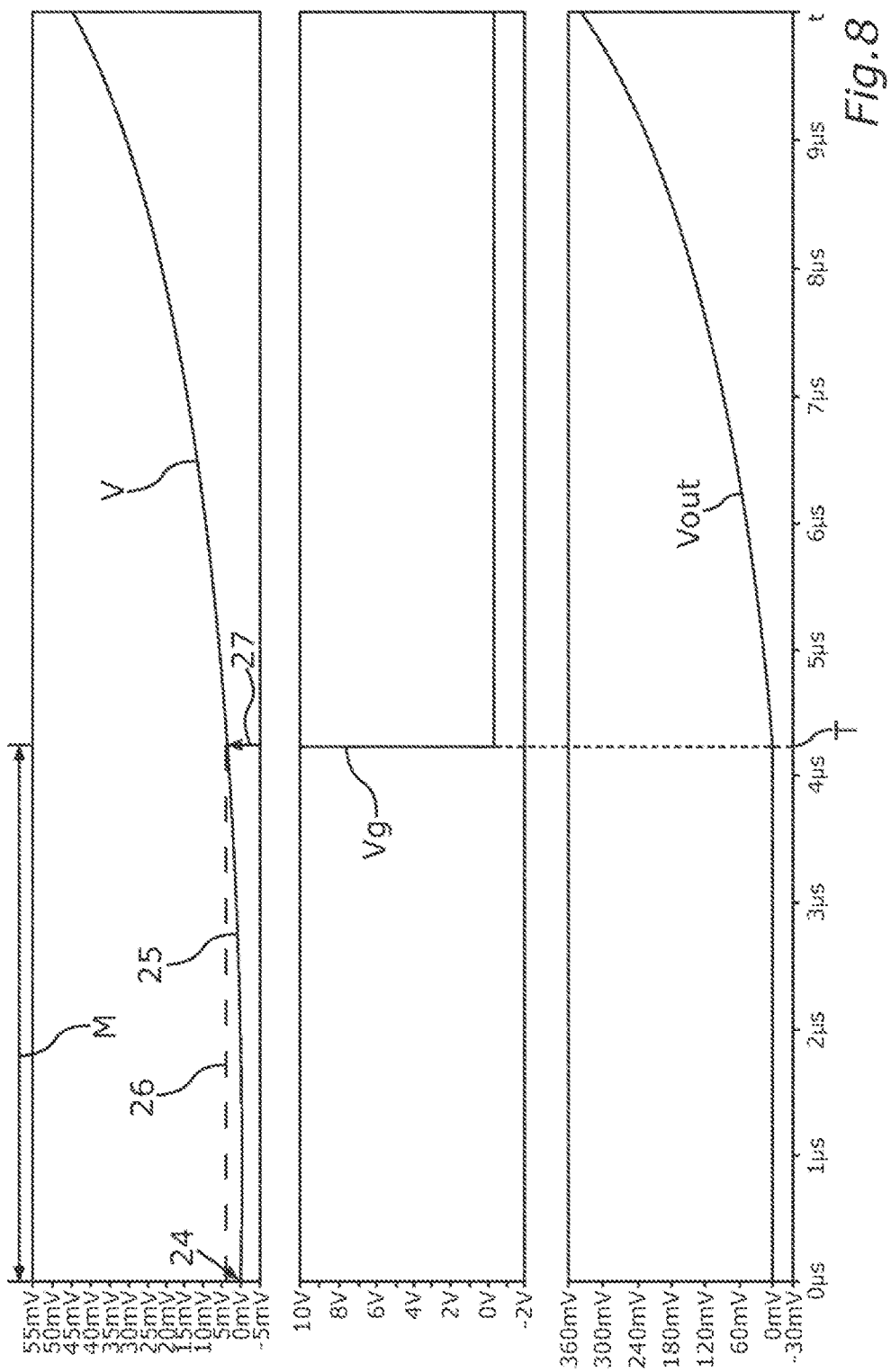
FIG. 8 shows a diagram with schematic profiles of electrical voltages of the converter circuit from FIG. 7.

FIG. 8 illustrates over time t the profiles of the voltage V, of the gate voltage Vg and of the output voltage Vout. Here, too, it is possible to define an ending criterion 26 for a boost converter which can be used if the condition I=0A is likewise defined as the operating point 24 for the start of the measurement cycle M.

Figure 9:
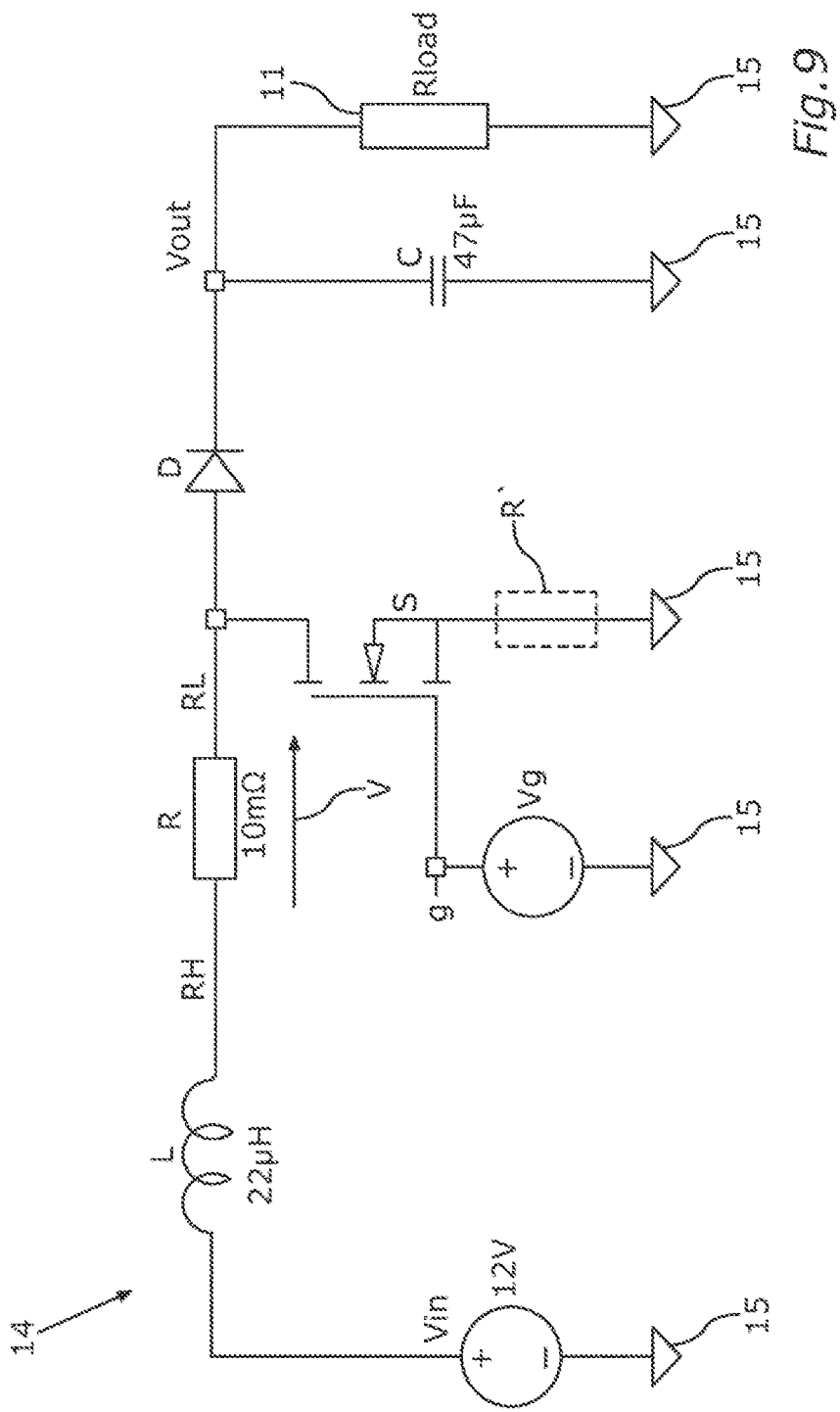
FIG. 9 shows a schematic circuit diagram of a further configuration of the converter circuit.

FIG. 9 illustrates a further embodiment of the converter circuit 14 as a boost converter. In the case of the converter circuit in accordance with FIG. 9, the inductance L is greater than in the case of the converter circuit in accordance with FIG. 7.

Figure 10:
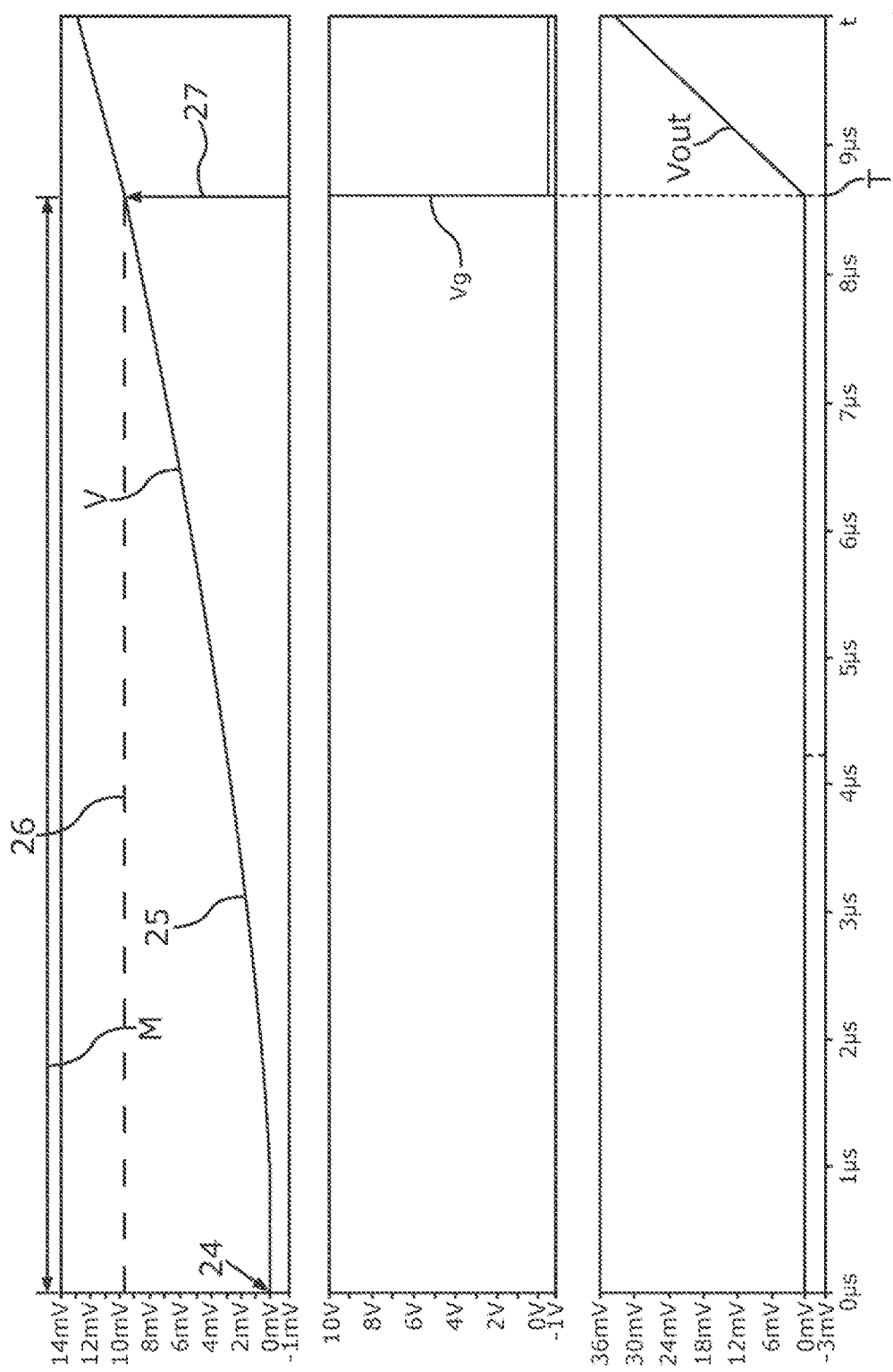
FIG. 10 shows a diagram with schematic profiles of electrical voltages of the converter circuit from FIG. 9.

FIG. 10 illustrates over time t that in this case, too, it is possible to define an ending criterion 26 for the measurement cycle M with which, proceeding from an operating point 24 (I=0A), the measurement time T until the voltage V reaches the threshold value 27 can be determined.

Figure 11:
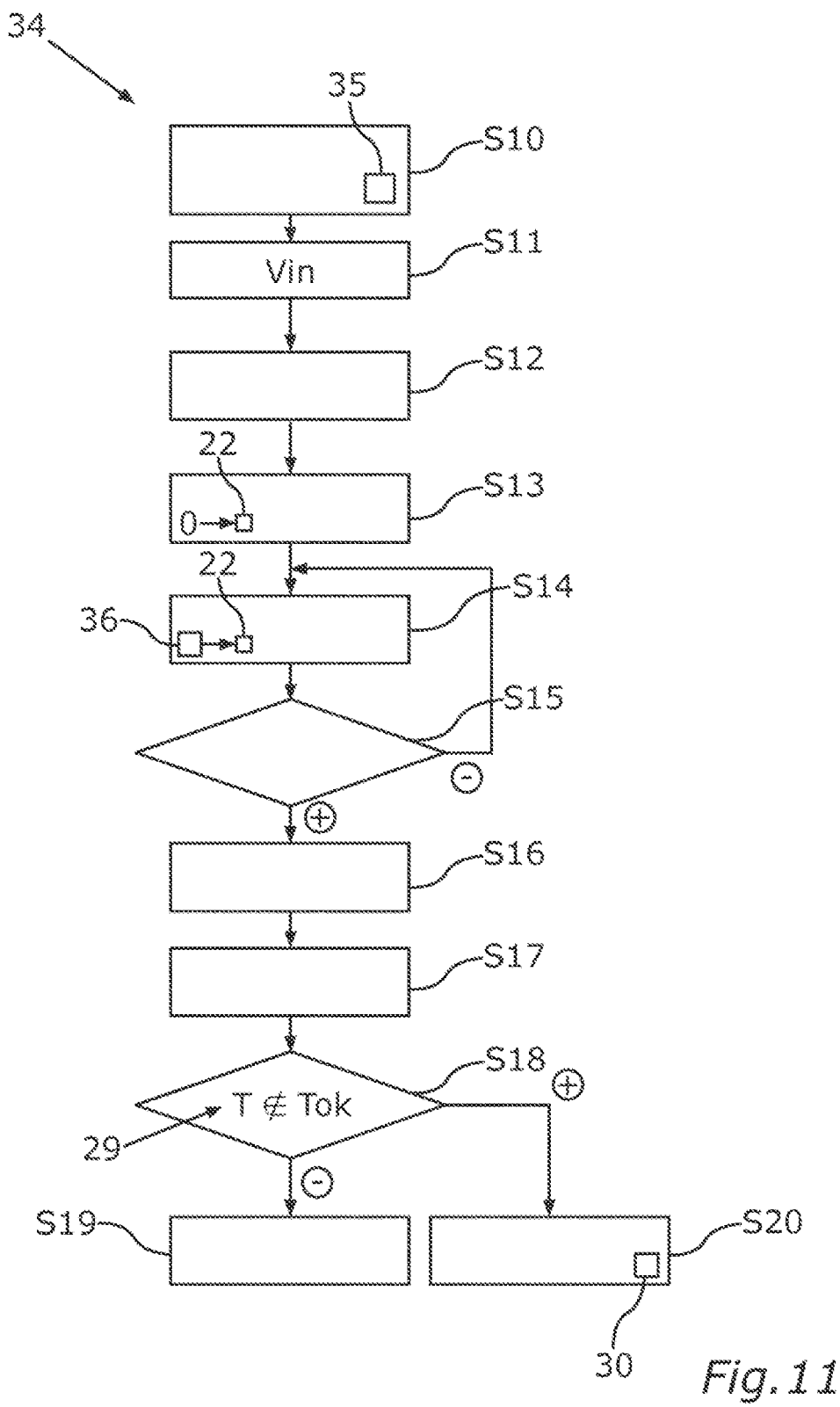
FIG. 11 shows a flow diagram of one embodiment of the method according to the invention.

FIG. 11 illustrates one possible configuration of a method 34 by means of which the self-test of the converter circuit 14 can be carried out on the basis of the ending criterion 26 and the reference interval Tok.

In a step S10, running through one or more measurement cycles M can be initiated for example depending on a trigger signal 35 for the self-test. Afterward, in a step S11, proceeding from the operating point 24 at which the converter circuit 14 is de-energized, the switch S can be closed in a step S12 and the supply voltage Vin can thus be applied, such that the current I can rise proceeding from the operating point 24. Together with the closing of the switch S, the counter 22 (see FIG. 1) can be started in a step S13. The time since the beginning of the measurement cycle M, that is to say since the closing of the switch S, is measured as a result. In step S13, the counter 22 is initialized with the value 0, for example.

In a step S14, the counter 22 can be incremented by means of a quartz oscillator or a clock 36.

In a step S15, a check can be made to ascertain whether the monitoring variable, here the voltage V, satisfies the ending criterion 26, that is to say reaches the threshold value 27. A negative test result (symbolized by a "−" sign in the figures) can lead back again to step S14, that is to say that there is a wait, as a result of which the counter 22 is incremented further by means of the clock 36. A positive test result (symbolized by a "+" sign in the figures) can lead to a step S16, which stops the counter 22. In a step S17, the switch S can also be opened, such that it is possible to prevent the output voltage Vout from rising further in the case of a buck converter. In a step S18, a check can be made to ascertain whether the test value 29 determined from the measured measurement time T, that is to say the counter reading of the counter 22, lies outside the reference interval Tok. If the test value 29 lies within the reference interval Tok (negative test result), then in a step S19 the converter circuit 14 can be signaled or cleared as "ok". The test value 29 is plausible. By contrast, in the case of a positive test result, that is to say if the test value 29 lies outside the reference interval Tok, the error signal 30 can be generated in a step S20.

The self-test can thus be ended.

Figure 12:
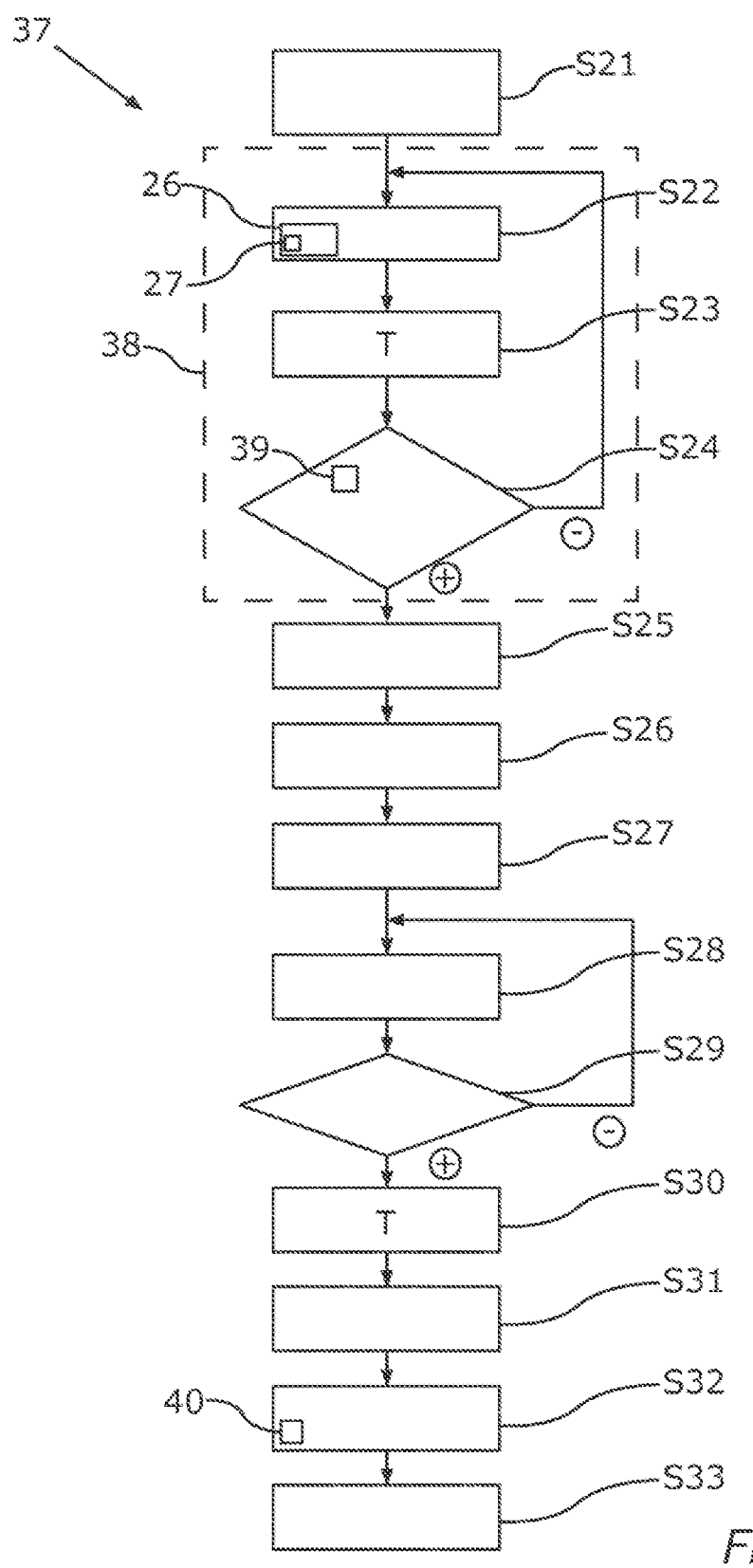
FIG. 12 shows a flow diagram of a calibration phase of the method from FIG. 11.

FIG. 12 illustrates a calibration phase 37, which can precede the method sequence in accordance with FIG. 11. In a step S21, the calibration phase can be started for example by the manufacturer of the converter circuit 14 or of the vehicle luminaire 10. An adjustment 38 of the ending criterion 26, for example of the threshold value 27, can then optionally be performed. For this purpose, in a step S22, the value of the supply voltage Vin can be defined and a threshold value 27 of the ending criterion 26 can be defined.

In a step S23, for example, on the basis of a simulation, it is possible to determine the expected measurement time T during which, proceeding from the known operating point 24, for example a start of operation at I=0A, the voltage V would have reached the threshold value 27 or generally the ending criterion 26 would be satisfied. In a step S24, with the aid of a plausibility criterion 39, a test can be carried out to establish whether the estimated measurement time T can be detected with a predetermined minimum accuracy of the time detecting unit, for example the counter 22. For this purpose, the estimated measurement time T can be divided by the so-called tick duration, that is to say the time duration between two incrementations of the clock 36, and a check can be made to ascertain whether the result lies in a predetermined plausibility interval. If this is not the case, a different threshold value 27 can be defined in the repetition of step S22. Otherwise, the adjustment 38 is ended and, in a step S25, the supply voltage Vin can be applied to the converter circuit 14, thus resulting in a start of operation of the converter circuit 14 at the operating point 24, and the switch S can be closed in a step S26. With the closing of the switch S, the counter 22 can be started in step S27. In this case, the counter 22 can be initialized with the value 0. In a step S28, the clock 36 can increment the counter 22. In a step S29, a check can be carried out to ascertain whether the monitoring variable, here the voltage V, has reached the threshold value 27 or generally whether the ending criterion 26 has been satisfied. If this is not the case, it is possible to continue further in step S28, that is to say that the time measurement carries on running. Otherwise, if the ending criterion 26 has been satisfied, the counter 22 can be stopped in a step S30. Generally, the measurement time T can thus be detected. In a step S31, the switch S can be opened. In a step S32, the measured measurement time T can thereupon be used to define the reference interval Tok. The reference interval Tok can contain the measured measurement time T, for example. It can optionally additionally include further values greater and/or less than the measured measurement time T. This can be defined on the basis of a predetermined tolerance value 40, which can define the size of the reference interval Tok. In a step S32, the calibration phase 37 can then be ended. Thus, the converter circuit 14 can now be delivered or cleared for operation.

In the case of an embodiment of the converter circuit 14, the objective thus consists in using means of an integrated circuit both to check the components, e.g. of a current controller, and to provide a self-test for its plausibilization, without having to solve the problem of the dependence on a reference or additional cost- and space-intensive components. It should be noted that a switching controller for vehicle lighting generally does not find stable or predictable states at its output since LED lighting units are constructed with series of individually bridgeable illuminants (the output voltage Vout is dependent on the state of charge of the capacitance C and the operating state of the functional circuit 11). These individual bridgings are activated and deactivated by a separate controller, not synchronized with the converter circuit 14. The state at the output of the switching controller 16 changes constantly as a result. For this reason, the control device 18 uses the initial state after start-up as the known operating point 24. It is not restricted to this point in time, however, primarily in the case of known relationships. The time required by the current I in the inductance L to change its amplitude by a certain value is used by the converter circuit 14 as a characteristic variable for the correctness of the current. For this purpose, the references and comparators available to the control are set such that the current amplitude, in the course of its change, assumes firstly one value and later the other value. The measurement time T therebetween is measured and used for the plausibilization. The simplest example is the initial state as output value (first value). Upon start-up, the current through the inductance is equal to zero. Thus, only a second value also has to be set. The latter is preferably set to be small enough that, firstly, a time that is measurable within reason still results and, secondly, a significant voltage is still not established at the output of the switching controller. In this case, the rise in the current is dependent on the input voltage and (depending on the topology of the switching controller) also on the output voltage. The latter is still zero, however, precisely at the switch-on instant, and at the end of the measurement is still small (the amplitude value of the current was ultimately set to be so small in order that exactly this voltage remains small) and thus negligible for the accuracy of the plausibilization. Here the problem is also already evident that variable relationships here directly influence the accuracy of the plausibilization; a careful choice of the parameters is therefore necessary. Moreover, the rise in the current is also dependent on the inductance. A reference time value appropriately matching the circuit must therefore be used for the plausibilization of the measured time value. The measured time value could also be normalized by way of a reference factor reflecting the characteristics of the circuit. However, since the input voltage also has an influence on the duration, this should be taken into account dynamically in the reference factor or in the assessment of the measured time value by means of a reference time value (e.g. by means of the calibration phase 37).

In practice the current amplitude is converted into a voltage V by way of a measurement resistor R. For circuits that operate with high currents I, small inductances L and small measurement resistors R are used, large inductances L and large measurement resistors R being more likely to be expedient in the case of circuits having small currents I. As a result, since the rise in current is linearly indirectly proportional to the inductance L but the rise in the voltage drop V is linearly directly proportional to the measurement resistance R, it becomes evident that the voltage value representing the current I through the measurement resistor R always—irrespective of whether the circuit was designed for large or small currents I—has a temporal profile that is virtually only dependent on the input and output voltages. If these are also under control (for instance the voltage at the output is zero at the switch-on instant, and is small relative to the input voltage at the end of the measurement), then only knowledge of these relationships is required and the correctness of the current I can be evaluated. Specifically, if the values of the components (R, L) are known, then the rise in current is also known. And if the latter is known, the length of time taken for the current amplitude to effect the desired change is known. If the length of time taken for that is too long or too short, then the reference value (formed from bandgap, voltage followers, the entire internal circuitry of the integrated component for controlling the current of the functional circuit with safety classification) is incorrect. Since a certain tolerance is permissible for achieving the safety objective of the lighting, this measurement also need not be particularly accurate. The error resulting from the small change in the output voltage during this plausibilization may therefore be disregarded.

The advantage which then results from this method is that the sufficient accuracy of the current of a switching controller can be checked by means of a time measurement, without leaving a gap in the plausibilization chain and without additional components. The function can be implemented very simply in a mixed-signal IC since it is purely digital, that is to say requires only a few gates. One example would be a circuit having an inductance L of 100 µH, a measurement resistance R of 100 mohms and a change in the current amplitude of 100 mA. Times of approximately 7 µs result here if the input voltage is approximately 10 V. The change in the voltage V measured across the measurement resistor R is then 10 mV. The same time results for 47 µH and 47 mohms and also 10 µH and 10 mohms if in each case the input voltage is once again 10 V and a change across the measurement resistor of 10 mV is sought. The change in the output voltage Vout is determined primarily by the output capacitance C, which has to take up the energy of the inductance L. Practical values are 0.5 µF for the smaller currents or 2.2 µF for the larger currents. For other reasons, larger values would be more likely to be chosen for C, which makes the error that much smaller.

In this respect, the circuit in accordance with FIG. 1 shows a buck converter consisting of a switch S, a diode D, the measurement resistor R, the inductance L and the output capacitor C. Furthermore, the voltage drop V across the measurement resistor R results, which is produced by the current I. The current I flows firstly through the inductance L, but also through the measurement resistor R. Its dynamic behavior is determined by the inductance L and the two voltages Vin and Vout (at least in that phase in which the switch S is closed). If the switch S is open, then the behavior is no longer dependent on Vin, but in return also on the voltage drop across the diode D—that is to say is largely provided with indeterminate variations. The behavior is best defined if Vin is large compared to Vout and the normal values (room temperature values) of R and L are known. L and R actually do not have to be known, provided that they are appropriate for the application. Once the measurement time T of the rise in current has been measured to a known value, then this time measurement can be used as a reference value. In a further measurement, a very similar value must then result (defined by Tok). Otherwise there has been a change in either the references for the voltage measurement or the measurement resistor R or the inductance L. All that would be an influence for the safety-relevant functional circuit and can be diagnosed by means of this method. In principle, any other rise in current or fall in current could be used for the plausibilization. However, at the beginning the boundary conditions are stable and known, whereas they are typically no longer stable during the operation of the current supply and the measured time is therefore subject to greater fluctuations requiring larger corrections or statistical methods. In this regard, by way of example, measurement could be carried out at a known operating point, and this measurement could be repeated relatively frequently and the time value of all the measurements could be averaged. A moving average value of a stable operating point could also be used, primarily if it is necessary to detect changes during operation. The method is not restricted just to the buck converter, although the latter is particularly suitable since the measurement resistor can be used both for the control and for the current measurement. In this case, the fact of whether the measurement resistor is provided upstream or downstream of the inductance is not critical either. The method also includes the fact that with a specific time t for which the switch S is closed, a change in the output voltage Vout results, which is used as a measure of the correctness. This method is suitable if the measurement resistor R is in series with the switch S rather than the inductance L and/or if the voltage Vout is the safety-relevant variable. Furthermore, the maximum value of the voltage V across the measurement resistor R after a known time duration T of the closed switch S could also be used for the plausibilization of the correctness of the control.

The plausibilization time of approximately 4 µs to approximately 10 µs determined by suitable selection of the measurement resistor and of the threshold voltage in the simulations carried out can be detected conveniently and with resolution in the modern IC systems having high clock rates. This time is simultaneously so short that it causes no significant changes in the remaining time sequences of the IC system (e.g. watchdog events, start-up routines).

Overall, the way in which a current intensity and a component in a switching converter can be plausibilized has thus been shown.

LIST OF REFERENCE SIGNS

10 Vehicle luminaire
11 Functional circuit
12 Light-emitting diode arrangement
13 Working voltage
14 Converter circuit
15 Ground potential
16 Switching converter
17 Measuring circuit
18 Control device
19 Comparator
20 Microcontroller
21 Comparison unit
22 Counter
23 Self-test
24 Operating point
25 Profile
26 Ending criterion
27 Threshold value
28 Test step
29 Test value
30 Error signal
31 On-board electrical system
32 Control circuit
33 Voltage value
34 Method
35 Trigger signal
36 Clock
37 Calibration phase
38 Adjustment
39 Plausibility criterion
40 Tolerance value
A Ellipsis
C Output capacitance
D Diode
g Gate
L Inductance
M Measurement cycle
R Measurement resistor
S Switch
T Measurement time
Tok Reference interval
Rload Load resistance
Rh Potential
RL Potential
R' Measurement resistor
S10-S33 Step
V Voltage
Vg Gate voltage
Vin Supply voltage
Vout Output voltage

The invention claimed is:

1. A method for carrying out a self-test of an electrical converter circuit, which comprises the steps of:
   starting a measurement cycle when the electrical converter circuit is operated, by means of a control device of the electrical converter circuit, proceeding from a known operating point of the electrical converter circuit at which a predetermined electrical operating variable has a predetermined starting value;
   detecting a time since the starting of the measurement cycle, and the predetermined electrical operating variable and the time constitute two monitoring variables that are monitored during the self-test;
   ending the measurement cycle upon determining that one of the two monitoring variables satisfies an ending criterion;
   forming a test value from a measurement value of the other of the two monitoring variables at an end of the measurement cycle; and
   performing a check to ascertain whether the test value lies outside a predetermined reference interval, and if so generating an error signal.

2. The method according to claim 1, which further comprises detecting an electrical current intensity of the electrical converter circuit and/or an electrical voltage correlated with the electrical current intensity and/or an output voltage of the electrical converter circuit as the predetermined electrical operating variable.

3. The method according to claim 1, wherein the ending criterion stipulates that the predetermined electrical operating variable must have a predetermined end value, and the test value is a time value and the predetermined reference interval specifies at least one okay time value.

4. The method according to claim 3, wherein the electrical converter circuit contains a two-point controller having at least one comparator or a digital comparison unit for a control of a voltage or a current and the ending criterion is implemented by means of the at least one comparator or the digital comparison unit of the two-point controller.

5. The method according to claim 1, wherein the ending criterion stipulates a predetermined time duration for the time and the test value is a value for the predetermined electrical operating variable and the predetermined reference interval stipulates at least one okay value for the predetermined electrical operating variable.

6. The method according to claim 1, wherein the time is detected by means of a counter of the control device.

7. The method according to claim 1, wherein, in a calibration phase, in which it is known that the electrical converter circuit is error-free, the measurement cycle is carried out at least once and, from the test value resulting at the end of the at least one measurement cycle carried out, the predetermined reference interval is generated on a basis of a predetermined tolerance value.

8. The method according to claim 1, wherein during the self-test the measurement cycle is carried out multiply such that a plurality of measurement values are present, and the test value is formed as an average value of the plurality of measurement values or as a moving average value.

9. The method according to claim 1, wherein an inductance of the electrical converter circuit and/or a measurement resistor are/is tested by means of the self-test.

10. The method according to claim 1, wherein for the measurement cycle the electrical converter circuit is operated by virtue of a fact that a switch of the electrical converter circuit is closed, and as a result, a current intensity of an electric current through the switch rises or falls for a duration of the measurement cycle.

11. The method according to claim 1, wherein at a start of operation, at which the predetermined electrical operating variable is equal to zero, is used as the known operating point.

12. The method according to claim 1, wherein at the known operating point and for each measurement value within the predetermined reference interval, an electrical output voltage of the electrical converter circuit remains below a working voltage of a functional circuit supplied by the electrical converter circuit.

13. The method according to claim 12, wherein the functional circuit is an LED lighting unit supplied by the electrical converter circuit.

14. The method according to claim 1, wherein the converter circuit is selected from the group consisting of a butt converter and a boost converter.

15. A converter circuit, comprising:
  a control device configured to carry out a method for performing a self-test on the converter circuit, said control device configured to:
  start a measurement cycle when the converter circuit is operated, by means of the control device, proceeding from a known operating point of the converter circuit at which a predetermined electrical operating variable has a predetermined starting value;
  detect a time since the starting of the measurement cycle, and the predetermined electrical operating variable and the time constitute two monitoring variables that are monitored during the self-test;
  end the measurement cycle upon determining that one of the two monitoring variables satisfies an ending criterion;
  form a test value from a measurement value of the other of the two monitoring variables at an end of the measurement cycle; and
  perform a check to ascertain whether the test value lies outside a predetermined reference interval, and if so generating an error signal.

16. A vehicle luminaire for a motor vehicle, comprising: a converter circuit according to claim 15.

17. The converter circuit according to claim 15, wherein the converter circuit is selected from the group consisting of a butt converter and a boost converter.

* * * * *